US010855504B2

(12) United States Patent
Lu et al.

(10) Patent No.: US 10,855,504 B2
(45) Date of Patent: Dec. 1, 2020

(54) METHOD, DECODER AND ENCODER FOR HANDLING A BIT STREAM FOR TRANSMISSION OVER A TRANSMISSION LINK BETWEEN A REMOTE UNIT AND A BASE UNIT OF A BASE STATION SYSTEM

(71) Applicant: Telefonaktiebolaget LM Ericsson (publ), Stockholm (SE)

(72) Inventors: Chenguang Lu, Sollentuna (SE); Miguel Berg, Sollentuna (SE); Nilma Fonseca, Canudos-Belem-Para (BR); Stefan Höst, Svedala (SE); Aldebaro Klautau, Marco-Belem-Para (BR); Leonardo Ramalho, Marambaia-Belem-Para (BR); Elmar Trojer, Täby (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 180 days.

(21) Appl. No.: 16/303,460

(22) PCT Filed: May 24, 2016

(86) PCT No.: PCT/SE2016/050480
§ 371 (c)(1),
(2) Date: Nov. 20, 2018

(87) PCT Pub. No.: WO2017/204704
PCT Pub. Date: Nov. 30, 2017

(65) Prior Publication Data
US 2020/0322204 A1 Oct. 8, 2020

(51) Int. Cl.
*H04L 27/26* (2006.01)
*H03M 7/40* (2006.01)
*H04W 88/08* (2009.01)

(52) U.S. Cl.
CPC .......... *H04L 27/2627* (2013.01); *H03M 7/40* (2013.01); *H04L 27/2649* (2013.01); *H04W 88/085* (2013.01)

(58) Field of Classification Search
CPC . H03M 7/3046; H03M 7/40; H04L 25/03178; H04L 27/2334; H04L 27/2626; H04L 27/2627; H04L 27/2649
See application file for complete search history.

(56) References Cited

U.S. PATENT DOCUMENTS 4,093,962 A * 6/1978 Ishiguro .............. H03M 7/3046
348/419.1
6,002,352 A * 12/1999 El-Ghoroury ......... H03M 1/208
341/139
(Continued)

FOREIGN PATENT DOCUMENTS

WO 2011/162723 A1 12/2011

OTHER PUBLICATIONS

International Search Report and Written Opinion issued in International Application No. PCT/SE2016/050480, dated Feb. 24, 2017, 13 pages.
(Continued)

*Primary Examiner* — Khanh C Tran
(74) *Attorney, Agent, or Firm* — Rothwell, Figg, Ernst & Manbeck, P.C.

(57) ABSTRACT

Described is a method performed by an encoder of a base station system (100) of a wireless communication network, for handling a bit stream for transmission over a transmission link (165) between a remote unit (160) and a base unit (170) of the base station system. The remote unit is arranged to transmit wireless signals to and receive from mobile stations (180). The bit stream comprises a first OFDM symbol and a second OFDM symbol, each OFDM symbol comprising a number of consecutive IQ samples. The
(Continued)

method comprises, for a first number of the IQ samples situated at a boundary between the first and the second OFDM symbol, transmitting, over the transmission link to a decoder of the base station system, the first number of IQ samples having a representation spanning a first amplitude range. The method further comprises, for a second number of IQ samples of the second OFDM symbol, following the first number of IQ samples, converting, using a predictive filter, individual of the second number of IQ samples to IQ prediction errors, where the IQ prediction errors have a representation spanning a second amplitude range that is smaller than the first amplitude range, and transmitting the IQ prediction errors over the transmission link to the decoder.

19 Claims, 8 Drawing Sheets

(56) References Cited

U.S. PATENT DOCUMENTS

| | | | | |
|---|---|---|---|---|
| 6,791,995 | B1* | 9/2004 | Azenkot | H04B 1/707 348/E5.008 |
| 9,729,215 | B2* | 8/2017 | Rahman | H03M 7/3082 |
| 2011/0069790 | A1* | 3/2011 | Okehie | H04L 25/022 375/340 |
| 2014/0064417 | A1* | 3/2014 | Azadet | H03F 1/3258 375/341 |
| 2015/0103751 | A1* | 4/2015 | Afkhami | H04B 3/54 370/329 |
| 2019/0312664 | A1* | 10/2019 | Klautau | H04L 1/0002 |

OTHER PUBLICATIONS

Nanba, S. et al., "A New IQ Data Compression Scheme for Front-haul Link in Centralized RAN", 2013 IEEE 24th International Symposium on Personal, Indoor and Mobile Radio Communications (PIMRC Workshops), IEEE, Sep. 8, 2013, pp. 210-214.

Lorca, J. et al., "Lossless Compression Technique for the Fronthaul of LTE/LTE-Advanced Cloud-RAN Architectures", 2013 IEEE 14th International Symposium on Networks (WOWMOM), IEEE, Jun. 4, 2013, pp. 1-9.

Choi, J. et al., "Space-Time Fronthaul Compression of Complex Baseband Uplink LTE Signals", 2016 IEEE International Conference on Communications (ICC), IEEE, May 22, 2016, pp. 1-6.

Guo, B. et al., "LTE/LTE-A Signal Compression on the CPRI Interface". Bell Labs Technical Journal, vol. 18, No. 2, Alcatel-Lucent, 2013, pp. 117-133.

* cited by examiner

METHOD, DECODER AND ENCODER FOR HANDLING A BIT STREAM FOR TRANSMISSION OVER A TRANSMISSION LINK BETWEEN A REMOTE UNIT AND A BASE UNIT OF A BASE STATION SYSTEM

CROSS REFERENCE TO RELATED APPLICATION(S)

This application is a 35 U.S.C. § 371 National Stage of International Patent Application No. PCT/SE2016/050480, filed May 24, 2016, designating the United States.

TECHNICAL FIELD

The present disclosure relates generally to methods, decoders and encoders of a base station system of a wireless communication network, for handling a bit stream for transmission over a transmission link between a remote unit and a base unit of the base station system.

BACKGROUND

There are today different concepts for distributing base station functionality onto different nodes into a so called base station system, also called distributed base station system. Basic purposes for distributing base station functionality are to improve radio coverage and to increase throughput to pieces of User Equipment, UEs. In a distributed base station system, base station functionality is typically distributed onto one or more base units and a plurality of remote units connected to a base unit via a transmission link that may be a copper link, a fiber link or a microwave link, for example. The remote units may alternatively be called remote radio heads, RRH, or radio resource units, RRU. The transmission link in such a base station system may be called a fronthaul link. Typically, the remote unit is responsible for transmitting and receiving signals wirelessly from/to mobile stations via one or more antennas. The remote unit has little functionality and can be made cheap and small, and the more intelligent functionality of a base station is moved to the base unit. Thereby, it may be cost-efficient for an operator to have many remote units close to the antenna covering a small geographical coverage area each, and to connect the remote units via a fronthaul link to a base unit. Further, a distributed base station may be cost-efficient as the base units, which are processing-heavy are centralized and can therefore share electrical power, cooling systems, processors etc. Also, to centralize base stations allows for co-ordination of traffic, e.g. mobility management, over a large coverage area. There are also variants of base station systems comprising an intermediate unit connected between the remote unit and the base unit. In such systems, the fronthaul is often referred to as the connection between the intermediate unit and the remote unit.

The base station system is one of the key enablers for centralized radio access network, C-RAN, to further increase network capacity, reduce the cost and energy consumption. One of the main obstacles for deploying base station system solution is the high speed transport requirement over the fronthaul, which may require deploying a lot of high speed links, e.g. with fiber and high quality copper cables, per base station system. This will increase the transport cost dramatically, which may jeopardize even the feasibility of the C-RAN concept, especially for 5G using very high bandwidth.

Figure 1:
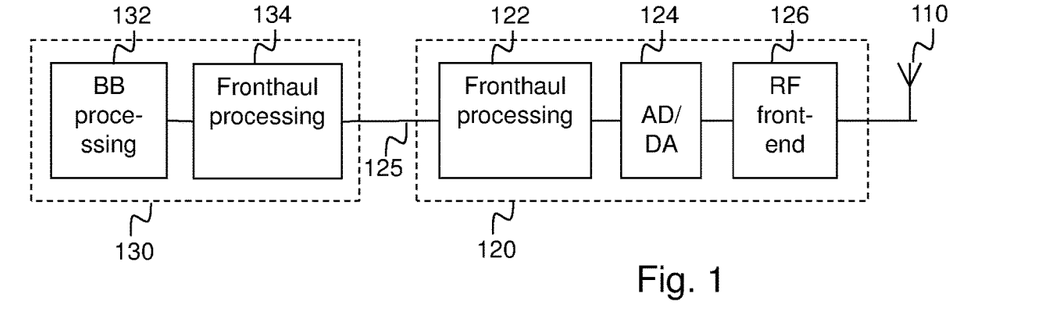
FIG. 1 is a schematic block diagram of a base station system according to the prior art.

FIG. 1 shows a basic block diagram of a prior art base station system comprising a base unit 130, a remote unit 120 connected to the base unit via a fronthaul link 125, and an antenna 110 connected to the remote unit 120. In downlink, DL communication, a baseband processing unit 132 of the base unit produce DL complex baseband signals in the format of IQ samples. Then the IQ samples are encapsulated by a fronthaul processing unit 134 according to a specific FH protocol, e.g. Common Public Radio Interface, CPRI, and transported over the fronthaul link 125 to the remote unit 120. At the remote unit 120, the IQ samples are de-capsulated and extracted by a fronthaul processing unit 122. Thereafter, the IQ samples are converted to an analog signal in a digital to analog converter, DA, 124 and transformed to a radio frequency, RF signal in an RF front end 126, which RF-signal is sent out from the antenna 110. In the uplink, the process is the opposite.

Regarding the IQ sample bit rate, a single 20 MHz Long Term Evolution, LTE, antenna carrier with 30.72 MHz sampling rate and 30 bits per IQ sample (15 bits I and 15 bits Q) requires approximately 922 Mbps though the traffic peak rate is only 100 Mbps (using 256 QAM modulation). Hence, the fronthaul link needs to carry more than 9 times the air-interface peak rate. Therefore, the capacity of the fronthaul link may become a bottleneck in terms of transmission capacity. The fronthaul problem is important and challenging and has become a hot area in the industry.

An approach under discussion in the industry for alleviating the fronthaul problem is to reduce the bit rate of the IQ samples by data compression. This allows backwards compatibility with the current transmission protocol used over the fronthaul, hereinafter called the FH protocol, e.g. CPRI. The advantage of transporting IQ samples over the FH protocol is its independency to all radio standards, as it works with the time domain signal directly. With the C-RAN approach, the coordination gain can be maximized by jointly processing the signals.

In the original non-compressed FH like CPRI, baseband IQ signals are typically oversampled in order to simplify analog filters for reconstruction and anti-aliasing. In LTE, a 70% oversampling is part of the design and is determined by the FFT size since it is desired to have an FFT size that is a power of two. For example, for a 20 MHz carrier, only 1200 out of 2048 subcarriers are used to load data. From the information theory perspective, the oversampling causes redundancy in the IQ samples since adjacent samples become correlated. Therefore, the bit rate can be reduced by removing the redundancy, which is usually referred to as data compression.

The document "A new IQ data compression scheme for fronthaul link in centralized RAN", by Nanba et al, in 2013 IEEE 24$^{th}$ International Symposium on Personal, Indoor and Mobile Radio Communications: Workshop on Cooperative and Heterogeneous Cellular Networks, pages 201-214, Sep. 8-9, 2013, discusses compressing IQ data to be sent over the fronthaul by using IQ bit width reduction and a common lossless audio compression scheme. In this document, Free Lossless Audio Codec, FLAC, which is an open-source audio compression software is applied to compress the IQ samples. FLAC is based on adaptive Linear Predictive Coding, LPC, which is well known in speech and audio data compression. In classical LPC, the data first pass through a linear predictive filter which produces the prediction errors. The prediction error is also referred to as the residue. In this way, the redundancy between samples is removed and the prediction error is usually smaller than the original samples. Then quantization of the smaller prediction error requires fewer bits than that of the original data. FLAC is designed to compress audio files offline and playback the file in real time. The compression by LPC is done adaptively. The predictive filter coefficients are automatically trained and adapted frame by frame over the audio file, so the complexity in compression is quite high. Processing delay can also be of an issue due to the complexity and the block-wise implementation for training the LPC. Another issue with using FLAC for compressing IQ samples is that FLAC is adapted for audio compression where two consecutive samples are related in some way for the file to be compressed, whereas for a signal comprising consecutive IQ samples there are no correlation between samples from two consecutive Orthogonal Frequency-Division Multiplexing, OFDM, symbols.

SUMMARY

It is an object of the invention to address at least some of the problems and issues outlined above. It is an object of embodiments of the invention to lower the amount of data that is to be sent over a transmission link when transmitting IQ samples between a base unit and a radio unit in a base station system. It is possible to achieve these objects and others by using a method and an apparatus as defined in the attached independent claims.

According to one aspect, a method is provided performed by an encoder of a base station system of a wireless communication network, for handling a bit stream for transmission over a transmission link between a remote unit and a base unit of the base station system. The remote unit is arranged to transmit wireless signals to, and receive from, mobile stations. The bit stream comprises a first OFDM symbol and a second OFDM symbol, each OFDM symbol comprising a number of consecutive IQ samples. The method comprises transmitting a first number of the IQ samples situated at a boundary between the first and the second OFDM symbol, over the transmission link to a decoder of the base station system, the first number of IQ samples having a representation spanning a first amplitude range. The method further comprises converting, using a predictive filter, individual of a second number of IQ samples of the second OFDM symbol, following the first number of IQ samples, to IQ prediction errors, where the IQ prediction errors have a representation spanning a second amplitude range that is smaller than the first amplitude range, and transmitting the IQ prediction errors over the transmission link to the decoder. Hereby it is achieved to lower the amount of data that is to be sent over the transmission link when transmitting IQ samples between the base unit and the radio at the same time as the air interface fulfills requirements from relevant radio standards.

According to another aspect, a method is provided performed by a decoder of a base station system of a wireless communication network, for handling a bit stream for reception over a transmission link between a remote unit and a base unit of the base station system. The remote unit is arranged to transmit wireless signals to and receive from mobile stations, the bit stream comprising a first OFDM symbol and a second OFDM symbol, each OFDM symbol comprising a number of consecutive IQ samples. The method comprises receiving over the transmission link from an encoder of the base station system, a first number of the IQ samples, situated at a boundary between the first and the second OFDM symbol, the first number of IQ samples having a representation spanning a first amplitude range. The method further comprises receiving, over the transmission link from the encoder, IQ prediction errors representing a second number of IQ samples of the second OFDM symbol, following the first number of IQ samples, the IQ prediction errors having a representation spanning a second amplitude range that is smaller than the first amplitude range, and converting, using a recovery predictive filter, individual of the IQ prediction errors to estimations of individual of the second number of IQ samples.

According to another aspect, an encoder is provided operable in a base station system of a wireless communication network, for handling a bit stream for transmission over a transmission link between a remote unit and a base unit of the base station system. The remote unit is arranged to transmit wireless signals to and receive wireless signals from mobile stations, the bit stream comprising a first OFDM symbol and a second OFDM symbol, each OFDM symbol comprising a number of consecutive IQ samples. The encoder comprises a processor and a memory. The memory contains instructions executable by said processor, whereby the encoder is operative for transmitting, over the transmission link to a decoder of the base station system, a first number of the IQ samples, situated at a boundary between the first and the second OFDM symbol, the first number of IQ samples having a representation spanning a first amplitude range. The encoder is further operative for converting, using a predictive filter, individual of a second number of IQ samples of the second OFDM symbol, following the first number of IQ samples, to IQ prediction errors, where the IQ prediction errors have a representation spanning a second amplitude range that is smaller than the first amplitude range, and for transmitting the IQ prediction errors over the transmission link to the decoder.

According to another aspect, a decoder is provided operable in a base station system of a wireless communication network, for handling a bit stream for reception over a transmission link between a remote unit and a base unit of the base station system. The remote unit is arranged to transmit wireless signals to and receive wireless signals from mobile stations. The bit stream comprises a first OFDM symbol and a second OFDM symbol, each OFDM symbol comprising a number of consecutive IQ samples. The decoder comprises a processor and a memory. The memory contains instructions executable by said processor, whereby the decoder is operative for receiving, over the transmission link from an encoder of the base station system, a first number of the IQ samples situated at a boundary between the first and the second OFDM symbol, the first number of IQ samples having a representation spanning a first amplitude range. The decoder is further operative for receiving, over the transmission link from the encoder, IQ prediction errors representing a second number of IQ samples of the second OFDM symbol, following the first number of IQ samples, the IQ prediction errors having a representation spanning a second amplitude range that is smaller than the first amplitude range, and converting, using a recovery predictive filter, individual of the IQ prediction errors to estimations of individual of the second number of IQ samples.

According to other aspects, computer programs and carriers are also provided, the details of which will be described in the claims and the detailed description.

Further possible features and benefits of this solution will become apparent from the detailed description below.

BRIEF DESCRIPTION OF DRAWINGS

The solution will now be described in more detail by means of exemplary embodiments and with reference to the accompanying drawings, in which.

DETAILED DESCRIPTION

Briefly described, a solution is provided for handling data comprising IQ samples that are to be transmitted over a fronthaul link between a base unit and a remote unit in a base station system so that the data is efficiently compressed at the same time as the air interface fulfills requirements from relevant radio standards, such as data of the IQ samples being interpretable by the receiving side, which in DL is the remote unit and in uplink, UL, is the base unit. This may be achieved by firstly transmitting to the receiving side a first number of IQ samples situated at a boundary between a first OFDM symbol and a second OFDM symbol immediately following the first symbol, for example the first 2 to 7 IQ samples of the second symbol, using a first number of bits per IQ sample. The first number of IQ samples may be sent un-coded. A second number of IQ samples of the second OFDM symbol, following the first number of IQ samples, are then compressed by converting the IQ samples to IQ prediction errors using a predictive filter into a second number of bits per IQ sample that are fewer than the first number of bits per IQ sample, and transmitting the IQ prediction errors to the receiving side. By treating the first IQ samples that are at a border between the first and the second OFDM symbol un-coded or at least with a code allowing more bits than the number of bits used for coding individual of the rest of the IQ samples of the second OFDM symbol, the problem that there is no correlation between IQ samples of different OFDM symbols has been alleviated, compared to prior art. The first number of IQ samples can also be used to detect large signal power or power spectral density changes and adapt a scaling factor for the prediction errors. Large power or power spectral density changes can happen for example when scheduling load changes, i.e. at the beginning of the first OFDM symbol of a new scheduling interval.

Figure 2:
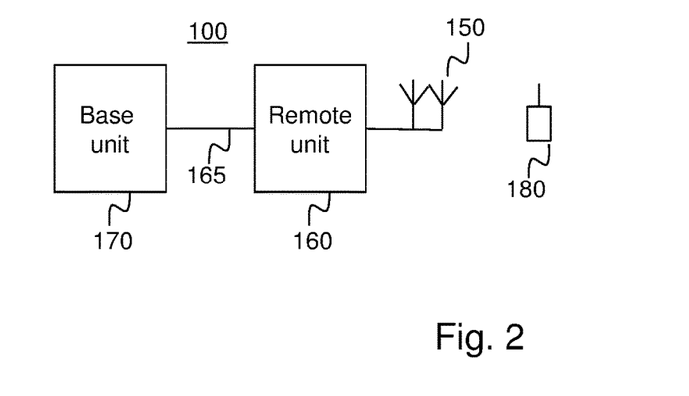
FIG. 2 is another schematic block diagram of a base station system.

FIG. 2 shows a base station system 100 of a wireless communication network. The base station system comprises a base unit 170, and a remote unit 160 connected via a transmission link 165 to the base unit. The transmission link 165 may be e.g. an optical transmission line, an electrical transmission line, a microwave link, or any type of short range radio point-to-point connection. The remote unit 160 is in its turn connected to one or more antennas 150, through which the remote unit transmits wireless signals to and receives wireless signals from mobile stations 180. The base unit is normally connected to a plurality of remote units that may or may not use the same transmission link for connection to the base unit. The base unit 170 of the base station system is in its turn, when connected to a wireless communication network, connected to other nodes of the network, such as other base station, network controlling nodes etc. in a regular way for base stations in wireless communication networks. The wireless communication network may be based on any kind of technology such as LTE, Wideband Code Division Multiple Access, W-CDMA, and Global System for Mobile communication, GSM, 3G etc.

Figure 3:
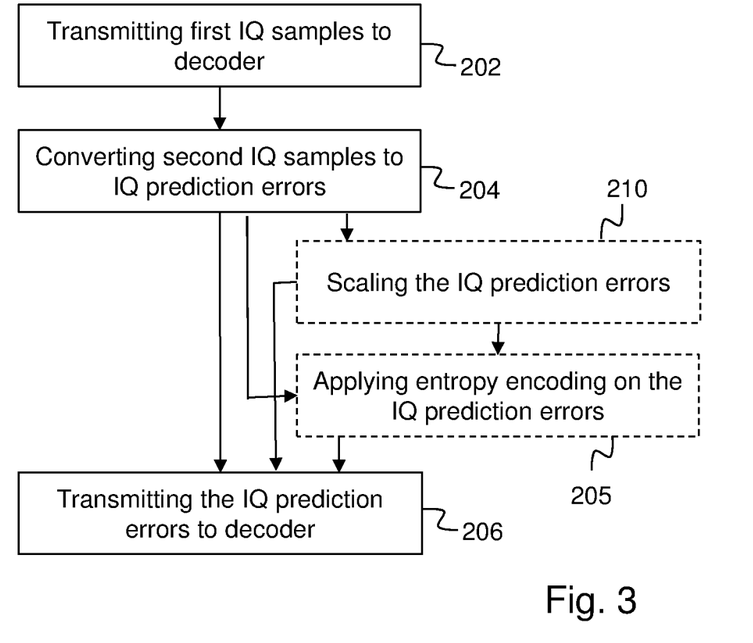
FIG. 3 is a flow chart illustrating a method performed by an encoder of a base station system, according to possible embodiments.

FIG. 3, in conjunction with FIG. 2, describes a method performed by an encoder of a base station system 100 of a wireless communication network, for handling a bit stream for transmission over a transmission link 165 between a remote unit 160 and a base unit 170 of the base station system. The remote unit is arranged to transmit wireless signals to and receive from mobile stations 180. The bit stream comprises a first OFDM symbol and a second OFDM symbol, each OFDM symbol comprising a number of consecutive IQ samples. The method comprising, for a first number of the IQ samples, situated at a boundary between the first and the second OFDM symbol, transmitting 202, over the transmission link to a decoder of the base station system, the first number of IQ samples having a representation spanning a first amplitude range. The method further comprises, for a second number of IQ samples of the second OFDM symbol, following the first number of IQ samples, converting 204, using a predictive filter, individual of the second number of IQ samples to IQ prediction errors, where the IQ prediction errors have a representation spanning a second amplitude range that is smaller than the first amplitude range, and transmitting 206 the IQ prediction errors over the transmission link to the decoder.

In case of downlink transmission, the encoder is situated at the base unit or in any other node or unit residing at the base unit side of the transmission link, and the decoder is situated at the remote unit or in any other node or unit residing at the remote unit side of the transmission link. In case of uplink transmission, the encoder is situated at the remote unit or in any other node or unit residing at the remote unit side of the transmission link, and the decoder is situated at the base unit or in any other node or unit residing at the base unit side of the transmission link. The boundary between the first and the second OFDM symbol may include any bits attached to the end of the first symbol or the beginning of the second symbol, which bits are redundant in respect of data to be transferred, such as a cyclic prefix attached to the beginning of the second symbol or a cyclic suffix attached to the end of the first symbol By such a compression of data that are to be transmitted over a transmission link of a base station system, capacity of the transmission link is saved. Further, at least for downlink communication there is no or at least little correlation between two consecutive IQ samples belonging to different OFDM symbols. Consequently, the last IQ samples of the first OFDM symbol, i.e. the IQ samples immediately before a boundary between the first and second OFDM symbol, do not give any relevant information for the first IQ samples of the second OFDM symbol. For this reason, the first number of IQ samples of an OFDM symbol are transmitted to the decoder having a representation spanning a first amplitude range that is higher/larger than the following OFDM symbols. For example, the first IQ samples of an OFDM symbol may be transmitted in original form, i.e. un-coded, whereas IQ samples of the same OFDM symbol following the first IQ samples are compressed by being converted to IQ prediction errors. By such a method, the data received at the decoding node have a small deviation from the original samples at the same time as the data has been compressed in a sufficient way for being able to get more data onto the transmission line between the remote unit and the base unit compared to when transmitting in a non-compressed mode.

According to an embodiment, the representation of the first number of IQ samples spanning a first amplitude range signifies that the first number of IQ samples are transmitted un-coded. In other words, the first number of IQ samples are transmitted as original samples to the decoder.

According to another embodiment, the representation of the first number of IQ samples spanning a first amplitude range signifies that the first number of IQ samples are quantized with a first number of bits before being transmitted, and wherein the IQ prediction errors of the second number of IQ samples are quantized with fewer bits than the first number of bits.

According to another embodiment, the method further comprises, for the second number of IQ samples, applying 205 an entropy encoding on the IQ prediction errors, and wherein the transmission 206 of IQ prediction errors comprises transmitting the entropy encoded IQ prediction errors to the decoder. This way an additional compression of the second number of IQ samples may be performed so that additional bandwidth is saved over the transmission link without any substantial loss of transmission quality. The entropy encoding may be a Huffman encoding.

According to an embodiment, a dictionary used for the entropy encoding is pre-set and kept un-changed for the bit stream.

According to another embodiment, the converting 204 of individual of the second number of IQ samples comprises determining a prediction of one sample of the second IQ samples based on one or more previous IQ samples immediately before the one sample, and calculating a prediction error as a difference between the determined prediction of the one IQ sample and an original, uncoded value of the one IQ sample. When compressing a bit stream by converting data, such as IQ samples, to prediction errors in a predictive filter, a prediction of a first IQ sample may be made based on one or more IQ samples that are immediately before the first IQ sample. How many previous IQ samples that are used in the prediction depends on the filter order (nth filter means n previous samples). Thereafter, the IQ prediction error of the first IQ sample is determined as a difference between the actual value of the first IQ sample and the prediction of the first IQ sample. The state of a predictive filter comprises memories of earlier IQ samples. Consequently, that the state of the predictive filter is reset at an OFDM symbol boundary may signify that there are no values of earlier IQ samples for an IQ sample directly following a reset. In other words, a first IQ sample after a reset will in this embodiment be sent as the original value, since the prediction error will be the same as the original value as the prediction will be zero when the state of the filter is reset.

According to an embodiment, the second OFDM symbol comprises a plurality of blocks of IQ samples, and for a first IQ sample of each block following a block border between two consecutive blocks, the first sample of each block is transmitted uncoded to the decoder. The uncoded first sample may also be used to fill the predictive filter. The first sample may comprise one or more samples. According to another embodiment, a state of the predictive filter is set to zero. To set a state of the predictive filter to zero signifies to set input of previous samples to zero when determining a prediction of one sample of the second IQ samples based on the previous IQ samples immediately before the one sample. By setting the state of the predictive filter to zero at the beginning of each block, it is prevented that a coding error is propagated over block boundaries.

According to another embodiment, filter coefficients of the predictive filter are pre-set and kept un-changed for the bit stream. A filter has n filter coefficients, i.e. the same as the filter order. The value on each filter coefficient is set beforehand and communicated between the encoder and the decoder so that the decoder knows the filter coefficients used by the encoder. Hereby, the running complexity of the filter is significantly reduced compared to an adaptive approach used for adaptive LPC in adaptive differential pulse-code modulation, ADPCM.

According to another embodiment, the method further comprises scaling 210 the IQ prediction errors based on a scaling factor. The scaling factor, $g(n)$, is selected so as to get a better utilization of the bits representing the second amplitude range. The scaling factor is useful for signals where a power spectral density, PSD, of a signal changes over time. This could be due to scheduling load variation and/or power control. PSD changes may lead to under- or overutilization of a quantizer range and thus sub-optimal performance. By multiplying prediction errors with $g(n)$ at the input of a quantizer and multiplying by $1/g(n)$ at the output of a de-quantizer, the quantization range is better utilized. According to an embodiment, the level of the first number of IQ samples may be used as input for setting the scaling factor. In a variant of this embodiment, the scaling may comprise scaling the IQ prediction errors based on a ratio between the signal level for the first number of samples and a nominal level. The nominal level may be pre-configured. According to another alternative, the scaling factor is continuously updated based on history of predicted samples. It is an advantage to base the scaling factor, $g(n)$, on data available at both the encoder and the decoder since it means that $g(n)$ does not have to be signaled from the encoder to the decoder. It is also possible to take into account e.g. scheduling and/or power control information from the baseband unit but then the $g(n)$ may have to be signaled over the fronthaul. Instead of multiplying the prediction error by $g(n)$ as described above, said scaling factor may also be implemented by multiplying the quantizer range by $1/g(n)$. In a similar manner, the de-quantizer range could be multiplied by $g(n)$ instead of multiplying the output value by $1/g(n)$.

In FIG. 3, the dashed lines for boxes 205 and 210 indicate that these steps are optional. The arrows indicate different ways how to perform the method, i.e. that none of steps 205 and 210 are performed, that any one of the steps are performed or that both steps are performed.

Figure 4:
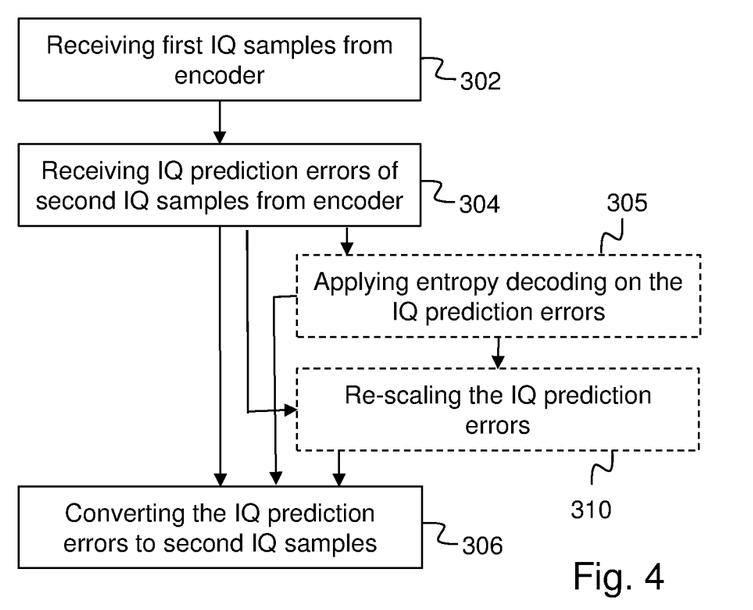
FIG. 4 is a flow chart illustrating a method performed by a decoder of a base station system, according to possible embodiments.

FIG. 4, in conjunction with FIG. 2, shows a method performed by a decoder of a base station system 100 of a wireless communication network, for handling a bit stream for reception over a transmission link 165 between a remote unit 160 and a base unit 170 of the base station system. The remote unit is arranged to transmit wireless signals to and receive from mobile stations 180. The bit stream comprises a first OFDM symbol and a second OFDM symbol, each OFDM symbol comprising a number of consecutive IQ samples. The method comprises, for a first number of the IQ samples situated at a boundary between the first and the second OFDM symbol, receiving 302, over the transmission link from an encoder of the base station system, the first number of IQ samples having a representation spanning a first amplitude range. The method further comprises, for a second number of IQ samples of the second OFDM symbol, following the first number of IQ samples, receiving 304, over the transmission link from the encoder, IQ prediction errors representing the second number of IQ samples, the IQ prediction errors have a representation spanning a second amplitude range that is smaller than the first amplitude range, and converting 306, using a recovery predictive filter, individual of the IQ prediction errors to estimations of the individual second number of IQ samples.

The first number of IQ samples are used to fill a memory of the recovery predictive filter, i.e. to set an initial predictor state that is identical to the state in the encoder. Once it is done, the predictor starts working and predicts the next sample, just as in the encoder. The difference is that the encoder subtracts predicted samples from original samples to get prediction errors while the decoder adds predicted samples to prediction errors to get an estimate of original samples.

According to an embodiment, the IQ prediction errors are received entropy encoded from the encoder, and the method further comprises, for the second number of IQ samples, applying 305 an entropy decoding on the entropy encoded IQ prediction errors. The decoder obtains information regarding which kind of entropy decoding to use. The decoder may receive this information from the encoder. Alternatively, it is configured at set-up. The entropy decoding used should be selected based on the used entropy encoding, i.e. as an inverse of the used entropy encoding.

According to another embodiment, the converting 306 of individual of the IQ prediction errors to estimates of the second number of IQ samples comprises determining a prediction of one sample of the second IQ samples based on one or more determined previous IQ samples immediately before the one sample, and a received prediction error.

Coefficients for the predictive filter A(z) are identical at both encoder and decoder and could be selected during set up, e.g. based on wireless carrier type and oversampling rate. For open-loop LPC, the transfer function Ha(z) of a predictor (in the encoder) is calculated as follows in z-transform domain: $e(z)=X(z)-A(z)*X(z) => e(z)=X(z)*(1-A(z))$. Thus, $Ha(z)=e(z)/X(z)=1-A(z)$.

The transfer function Hs(z) of a recovery predictor (in the decoder) is calculated as: $X(z)=A(z)*X(z)+e(z) => X(z)(1-A(z))=e(z) => Hs(z)=X(z)/e(z)=1/(1-A(z))$. The inverse seen in Hs(z) is because the decoder has A(z) in a feedback path. According to an embodiment, a closed loop predictor may be used where the quantization error is included in the prediction on the encoder side. This gives better performance.

According to another embodiment, the second OFDM symbol comprises a plurality of blocks of IQ samples. Further, for a first IQ sample of each block, following a block border between two consecutive blocks, the first sample of each block is transmitted uncoded to the decoder.

According to another embodiment, filter coefficients of the recovery predictive filter are pre-set to the same values as for filter coefficients of a predictive filter at the encoder, and kept un-changed for the bit stream.

According to another embodiment, the method further comprises re-scaling 310 the IQ prediction errors based on an inverse of a scaling factor used at the encoder. The scaling factor may be communicated from the encoder to the decoder in connection with the reception of the IQ prediction errors or a nominal value may be used that may be pre-configured at both encoder and decoder.

In FIG. 4, the dashed lines for boxes 305 and 310 indicate that these steps are optional. The arrows of FIG. 4 indicate different ways how to perform the method, i.e. that none of steps 305 and 310 are performed, that any one of the steps are performed or that both steps are performed.

Figure 5:
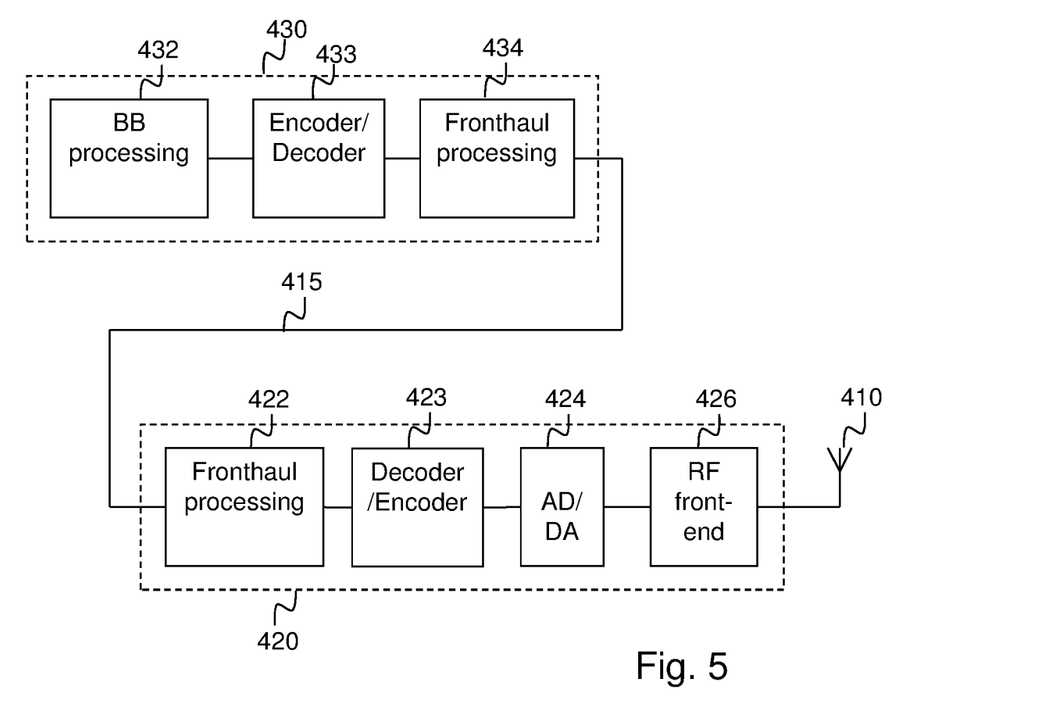
FIG. 5 is a schematic block diagram of a base station system according to possible embodiments.

FIG. 5 shows basic block diagrams of a base unit 430 and a remote unit 420 for compressing and decompressing IQ samples. The base unit and the remote unit are interconnected via a transmission link 415. In downlink, signals that are to be sent to mobile stations are processed in a base band processing unit 432 into IQ samples. The IQ samples are then encoded into a compressed format in an encoder/decoder 433 such that the coded IQ samples have lower bit rate than the un-coded IQ samples. The coded IQ samples are then encapsulated in a fronthaul processing unit 434 into a format suitable for transmission over the transmission link 415. After being transmitted over transmission link 415, the IQ samples are de-capsulated in a fronthaul processing unit 422 of the remote unit. The extracted coded IQ samples are decoded in an encoder/decoder 423 of the remote unit and converted into analogue format in an AD/DA converter 424. The RF front-end 426 then sees to that the analogue signals are transmitted from the antenna 410 over the air interface towards mobile stations. For uplink communication, the process is the opposite. I.e., a signal received at the antenna 410 is handled by the RF front-end 426, converted into digital format IQ samples in the AD/DA converter 424, and the IQ samples are encoded into a compressed format in the decoder/encoder 423. The coded IQ samples are then encapsulated in the fronthaul processing unit 422 and transmitted over the fronthaul to the base unit. At the base unit 430, the encapsulated and coded IQ samples are de-capsulated in the fronthaul processing unit 434, decoded in the encoder/decoder 433 and the decoded IQ samples are then baseband processed by the baseband processing unit 432.

Figure 6:
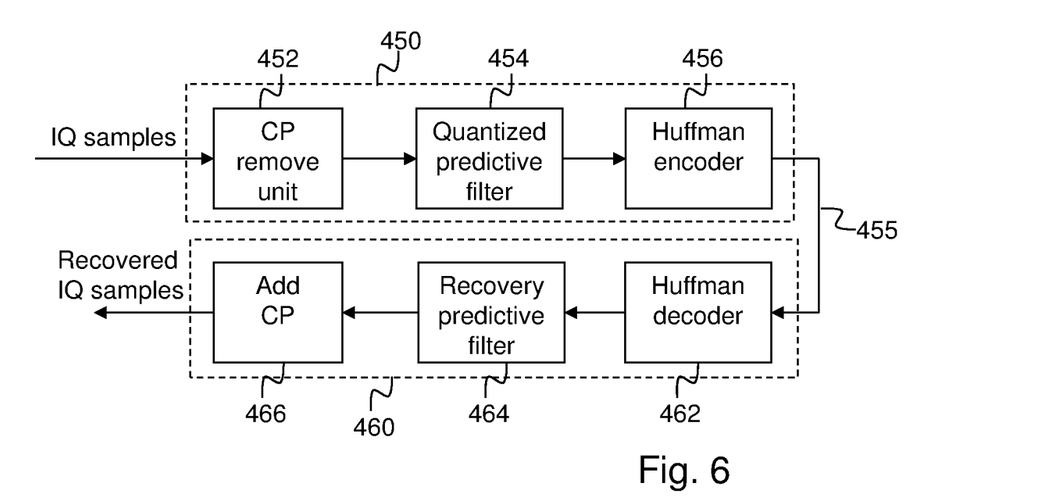
FIG. 6 is a schematic block diagram of an encoder and a decoder, according to possible embodiments.

FIG. 6 shows a basic block diagram illustrating an embodiment of the invention for compressing and decompressing IQ samples. An encoder 450 receives a stream of IQ samples and removes cyclic prefix, CP, from the stream in a CP remove unit 452, if CP has been used. The IQ samples are then treated in a quantized predictive filter 454 into prediction errors. Following the linear prediction theory, the predictive filter 454 applies the minimum mean square error, MMSE, criterion to minimize the prediction error. The predictive filter 454 may act as a whitening filter, removing the correlation of input samples. The colored IQ samples are converted ideally to white prediction errors. The prediction errors are usually smaller than original IQ samples and thereby can be quantized with fewer bits achieving the same level of precision. Thereafter the quantized prediction errors are further compressed by a Huffman encoder 456 in a lossless manner to achieve the entropy of the error data. Note that other binary code can be used instead of Huffman. After the encoded, compressed IQ samples have been transmitted over the transmission link 455 to a decoder 460, the encoded IQ samples are decoded in a Huffman decoder 462 into prediction errors which are further transformed in a recovery predictive filter 464 into decoded IQ samples resembling the original IQ samples that were input into the predictive filter 454 of the encoder. The recovery predictive filter 464 has the same structure and coefficients as the predictive filter 454 of the encoder. Thereafter, a cyclic prefix is added before the recovered IQ samples are further treated at the receiver side. Note that for downlink communication the encoder 450 is situated in the base unit and the decoder 460 is situated in the remote unit, and for uplink communication the encoder 450 is situated in the remote unit and the decoder 460 is situated in the base unit.

According to another embodiment, a few initial IQ samples per OFMD symbol are used to initiate the predictive filter of the encoder. These initial IQ samples are quantized with more bits than the following IQ samples of the OFDM symbol that are quantized into prediction errors. The initial IQ samples are also sent to the decoder to initiate the recovery predictive filter. According to an embodiment, the state of the predictive filter (and the recovery predictive filter) is reset every block of $N_b$ samples to deal with the boundary between OFDM symbols.

According to another embodiment, the predictive filter coefficients and the Huffman code dictionary are pre-trained. Pre-training means here that the coefficients and the dictionary are either trained and set by offline testing, e.g. lab tests, simulations, calculations etc., or is online trained only once during an initialization phase. Once the configuration is determined and set, it is unchanged if the signal configuration is unchanged. In this way, the runtime complexity is kept low. The predictive filter usually has a quite low order, e.g. in the range of 4-6, to achieve sufficient prediction gain. The Huffman coding only involves operations using a small look-up table. With 5 bits quantization of prediction errors, only 32 entries are needed in the table.

The compression technique discussed in the mentioned prior art by Nanba et al is a classic adaptive LPC implementation. Here the signals are divided in frames. In each frame, the predictive filter coefficients are trained and adapted. In other words, the predictive filter coefficients are changed between the frames, as well as quantizer parameters. However, in embodiments of the present invention, the predictive filter coefficients are pre-trained and kept unchanged over the running time of the encoder-decoder, which gives a less complex solution and therefore quicker signal handling than the prior art. Further, in the prior art LPC implementation, the filter runs continuously and therefore continuously updates its state with predictions based on earlier IQ samples, as this is the best way for handling audio coding, which could be seen as a continuous signal. However, for IQ samples there are no correlation between IQ samples belonging to different OFDM symbols. Therefore, in embodiments of the present invention, the state of the predictive filter is reset at boundaries between consecutive OFDM symbols. Resetting the filter may signify to send the first IQ samples of an OFDM symbol un-coded or at least with less coding then the rest of the IQ samples, until the state of the filter is filled again with prediction errors originating from the same OFDM symbol. Hereby, IQ samples from an earlier OFDM symbol is not wrongly influencing the first IQ samples of another OFDM symbol. Further, resetting the filter at the OFDM boundary reduces Huffman coding complexity since the dynamic range of prediction errors becomes smaller. In another embodiment of the present invention, the state of the predictive filter is reset at every block of an OFDM symbol. Hereby it is avoided that any faults in the determination made for one block is transferred from one block to the next. According to another embodiment, the non-predicted or at least less predicted samples sent after each predictive filter state reset can be used by the encoder and decoder to determine a suitable block scaling coefficient, based on statistics of the non-predicted samples. This allows better utilization of the quantization range when the signal has a large dynamic range.

Figure 7:
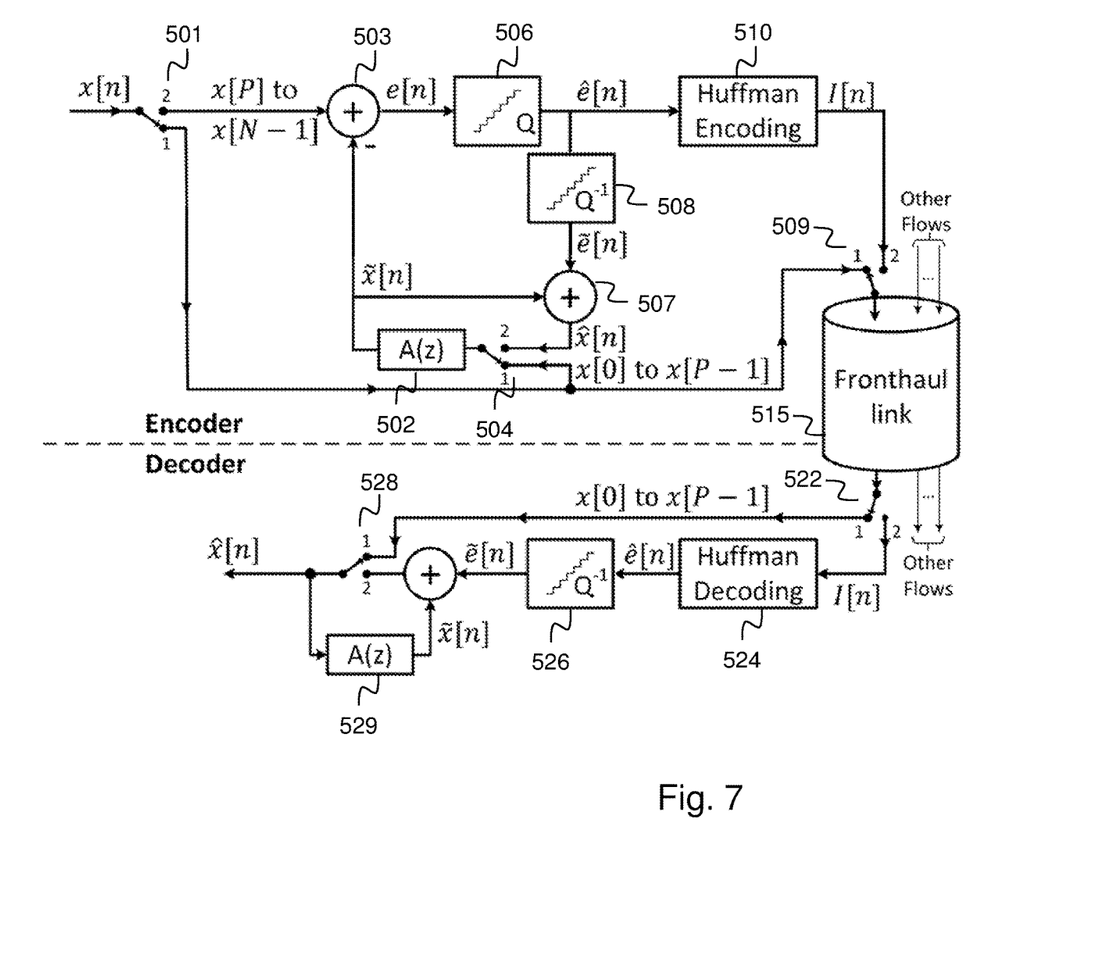
FIG. 7 is schematic block diagram of an encoder and a decoder in more detail.

FIG. 7 shows an embodiment of an encoder and a decoder in more detail. In the embodiment, the predictive filter coefficients, A(z), and the Huffman dictionary are obtained from pre-training and thereafter fixed. Input IQ samples x[n] are received at an input of the encoder, already quantized with a high number of bits, e.g. 15 bits per IQ sample. The encoder and decoder have two states. In a first state, in which switches 501, 504, 509 of the encoder and switches 522 and 528 of the decoder are set to "1", the first P samples x[0] to x[P−1] of each OFDM symbol are treated. The first state is used following a reset of the state of the predictive filter 502 of the encoder and a corresponding reset of the state of a recovery predictive filter 529 of the decoder. The predictive filter 502 is arranged to predict the next IQ sample from the previous P samples. The transfer function of the predictive filter is defined as $$A(z) = \sum_{i=1}^{P} a_i z^{-i}$$

where $a_i$ is the ith coefficients and P is the predictor order. However, the first P samples, following a reset of the state of the predictive filter are pushed directly to the predictive filter via switches 501 and 504, hereby filling the emptied state of the predictive filter with original samples, or replacing any previous content of the predictive filter with the original samples. The original samples are at the same time sent directly to the decoder via switches 501 and 509 and through a fronthaul protocol over the fronthaul link 515. At the decoder, the original samples x[0] to x[P−1] are sent directly to the decoder output via switch 528.

In a second state, following the first state, the switches 501, 504, 509, 522 and 528 are set to "2". Consequently, the IQ samples x[P] to x[N−1], N being the number of IQ samples of an OFDM symbol, are directed via switch 501 to an adder 503. At the adder, the actual IQ sample is subtracted with a prediction of the IQ sample performed by the loop comprising a quantizer 506 (may also be called a requantizer as the signal x[n] is already quantized at the input), a dequantizer 508, an adder 507 and the predictive filter 502, so that a prediction error e[n] is calculated as output from adder 503. The dequantizer 508 restores bit width of the bits of the prediction error quantized in the quantizer 506 to original value, and if a scaling factor g(n) was used in the quantizer it also undoes the scaling. The (quantized) predicted sample that is produced by the predictive filter 502 is calculated as $$\tilde{x}[n] = \sum_{i=1}^{P} a_i \hat{x}[n-i],$$

where $\hat{x}[n]=\tilde{x}[n]+\hat{e}[n]$ is the nth quantized IQ sample and $\hat{e}[n]$ represents the value in the original number of bits for the requantized prediction error of $\hat{e}[n]$, where $\hat{e}[n]$ is the quantized value of $e[n]=x[n]−\tilde{x}[n]$ with smaller number of bits from the quantization Q. Value-wise, $\hat{e}[n]=\hat{e}[n]$. They are just formatted with different number of bits. The prediction error e[n] is quantized by the quantizer 506 and the quantized prediction error ê[n] is sent to a Huffman encoder 510 for further coding into a Huffman encoded signal l[n]. The Huffman encoded signal l[n] is sent via switch 509 and the fronthaul link 515 to the decoder.

At the decoder, the Huffman coded signal is Huffman decoded 524 and requantized 526 back to to ê[n] of the original number of bits as the original IQ samples of x[n]. Following the same prediction structure as on the encoder side, with ê[n] and the first P original samples of x[0] to x[P−1], the quantized IQ samples of x̂[n] can be recovered. It is noted that in the diagram the quantizer (i.e. Q and $Q^{-1}$) does only the quantization conversion from the originally quantized input signal x[n], so it is sometimes called requantization.

According to an embodiment, the state of the predictive filter is reset per block of $N_b$ samples, an OFDM symbol comprising a plurality of sample blocks. One advantage of the reset is to avoid error propagation between blocks. Even though the fronthaul link is supposed to be robust with a very low packet error rate, there will be still packet errors from time to time. The bit errors on the prediction error will be propagated through the prediction structure to all following samples without a state reset. This could significantly degrade the quality of the recovered IQ samples. With a block reset, the error propagation is limited to each block.

Figure 8:
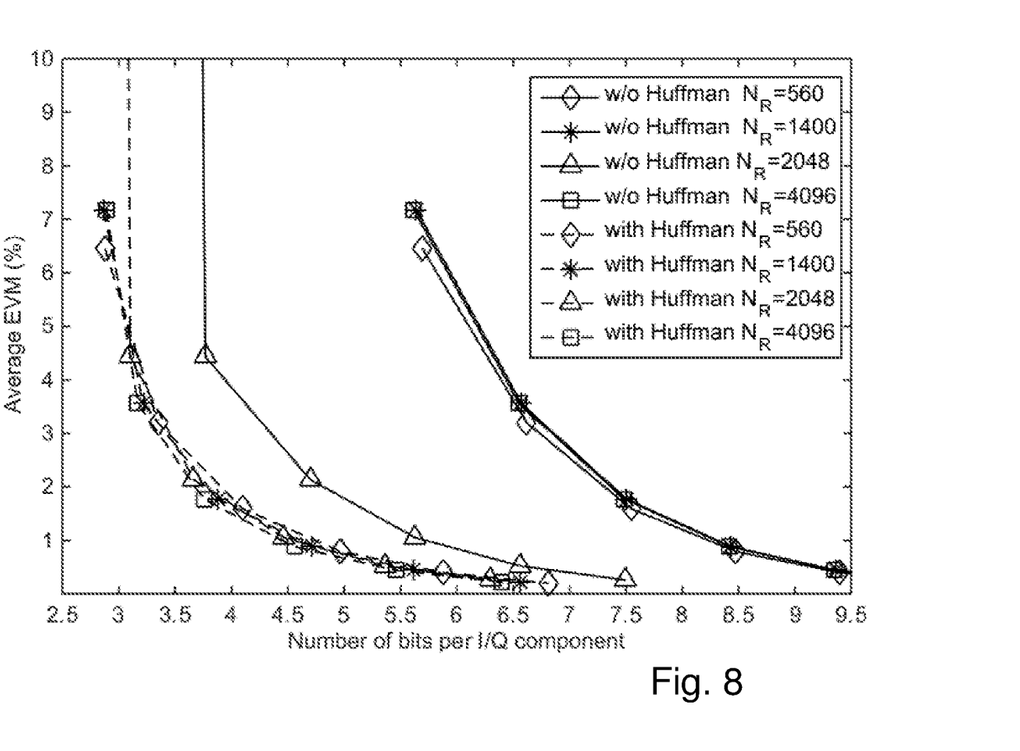
FIG. 8 is an x-y diagram showing average EVM versus number of bits after compression shown with and without Huffman coding for different values of reset block size.

The diagram of FIG. 8, which shows average error vector magnitude, EVM, on the y-axis and number of bits per IQ component on the y-axis, shows simulated compression results with and without using Huffman coding for different reset times $N_b$. The size of an OFDM symbol is 2048 samples. With $N_b$=2048 samples, the predictive filter resets at the first sample of each OFDM symbol, i.e. each OFDM symbol boundary. With the other simulated reset times, i.e. $N_b$=560, 1400 and 4096 samples, respectively, the predictive filter is not reset at the OFDM symbol boundary and thereby some or all blocks contain the boundary. From FIG. 8 it can be seen that the compression curves are close for all reset times when Huffman coding is used. However, without Huffman coding, resetting at the OFDM symbol boundary is much better than not resetting at the boundary (Nb=2048 w/o Huffman). This indicates that more bits are required in the quantizer Q if the predictive filter does not reset at OFDM symbol boundaries. This would also dramatically increase the look-up table size in Huffman implementation and therefore increase complexity. For example, at ~2% EVM, the quantizer for $N_b$=2048 requires 5 bits only, while other cases requires 8 bits. The look-up table for 5 bits has only 32 entries, while the table for 8 bits is 8 times larger and therefore has 256 entries. The complexity is much higher. Consequently, even though the compression achieved when using Huffman is the same for all tested reset times, it would require a much more complex Huffman coding to achieve this compression when the predictive filter is not reset at OFDM symbol boundaries compared to when it is reset at OFDM symbol boundaries.

Figure 9:
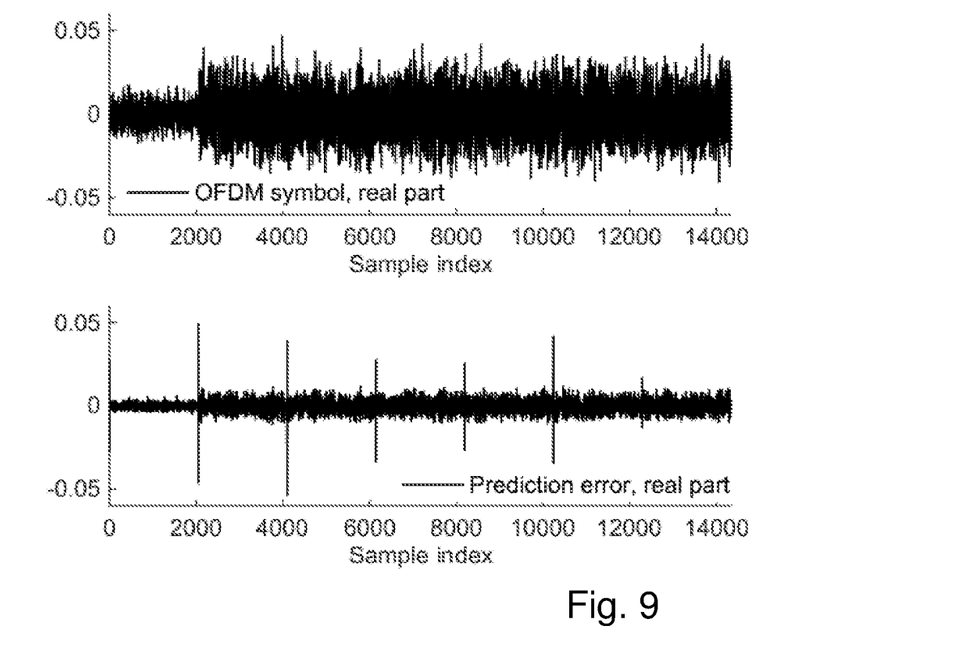
FIG. 9 shows two x-y are illustrating block effect due to discontinuity between OFDM symbols. The upper diagram shows OFDM symbols and the lower diagram shows prediction error.

If the state of the predictive filter is not reset at each OFDM symbol boundary, large prediction errors are caused in the first samples of each symbol. This can be seen in the simulated results in FIG. 9 in the shape of prediction error peaks at n*2048, n=1, 2, 3, 4 . . . . As the OFDM symbols are independent from each other there is little or no correlation between any two consecutive OFDM symbols. Consequently, if samples from a current OFDM symbol is predicted based on samples of the previous OFDM symbol, large errors may occur. However, it normally only happens for the first few samples in the beginning of each OFDM symbol depending on the prediction order, which is normally quite small. These large prediction errors increase the dynamic range of the quantizer input and drives up the required number of bits to achieve the sufficient precision.

Furthermore, there might be a need for the quantizer in the prediction loop to scale the prediction error. Especially in uplink, the signal power varies over time. It may be beneficial that the prediction errors are scaled to avoid clipping strong signals and avoid high quantization noise for weak signals. In an embodiment, the predictive filter resets per block. The first non-predicted samples in each block may be preserved in the original number of bits and directly sent to the decoder. The scaling factor can be derived from theses samples. If the same algorithm for setting the scaling factor based on the first non-predicted samples is used on the both sides, there is no need to transport the scaling factor. This would reduce the overhead and facilitate the en/decapculation process.

Figure 10:
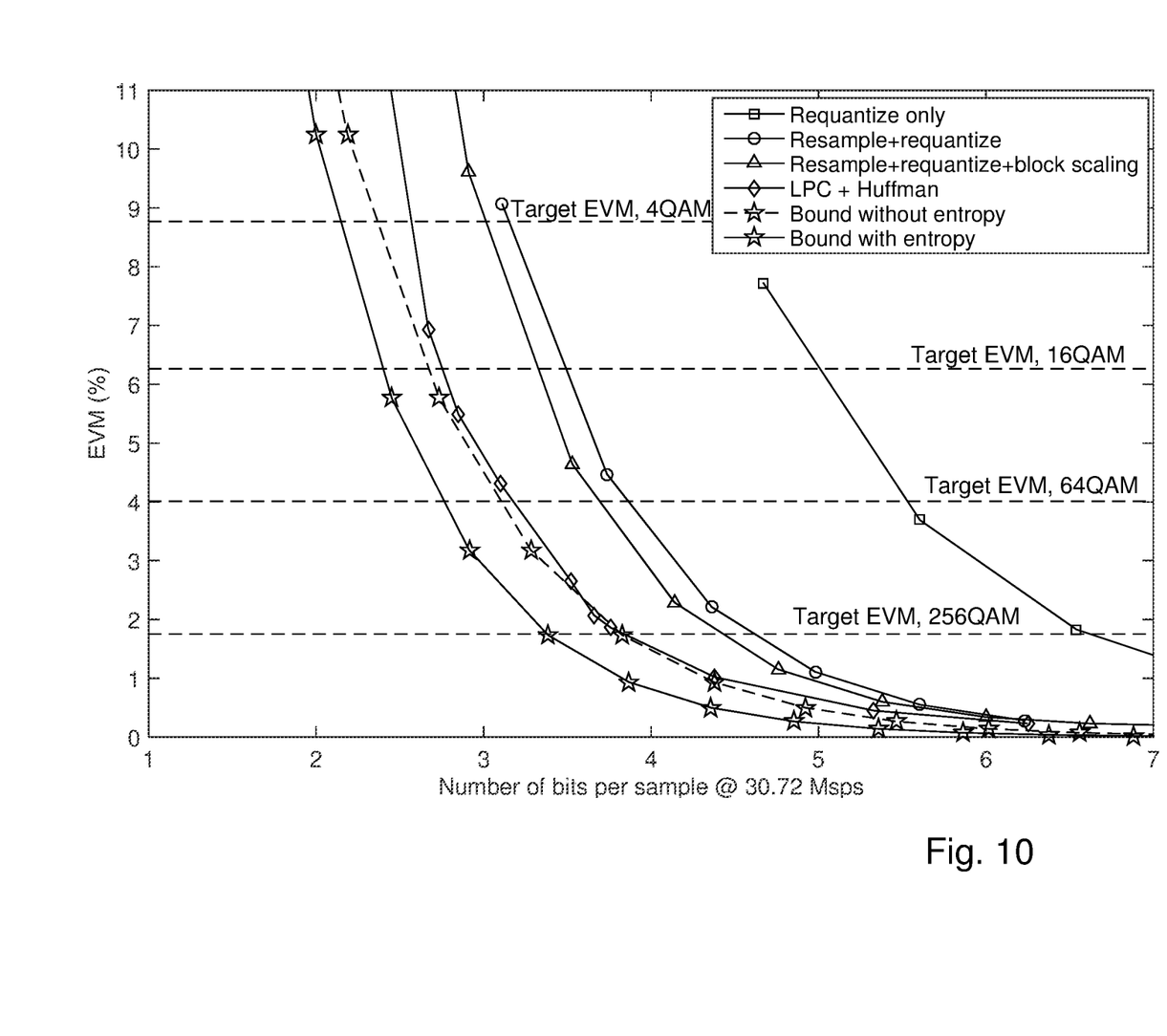
FIG. 10 is an x-y diagram showing EVM versus number of bits per sample for different compression techniques.

FIG. 10 shows compression performance of an embodiment of the present invention wherein a predictive filter and Huffman coding is used, compared with previous resampling-based and/or re-quantization based approaches. The previous resampling based approach resamples from 30.72 to 20.48 Msamples/s for a 20 MHz LTE carrier, which corresponds to 13.7% oversampling compared with the critical (Nyqvist) sampling rate of 18.015 Msamples/s. This embodiment of the invention (called LPC+Huffman in FIG. 10) achieves ~10% better compression than the resampling-based approach that in addition uses re-quantization, even when block scaling is used together with resampling (the latter called Resample+requantize+block scaling in FIG. 10). It can also be observed that this embodiment is close to the theoretical bound for time-domain signal compression without entropy (Bound without entropy in FIG. 10).

Figure 11:
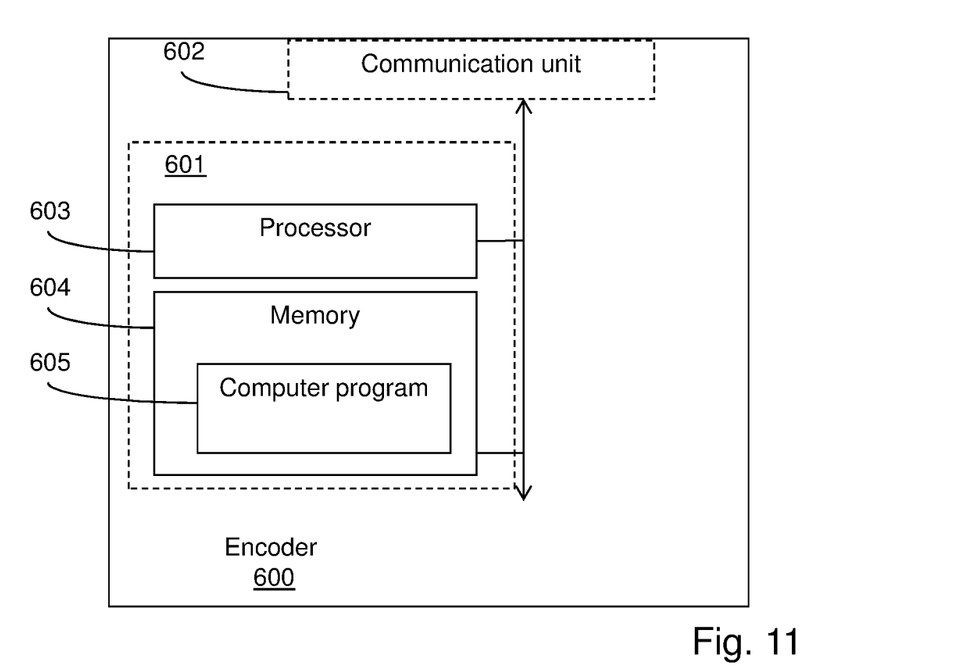
FIGS. 11-12 are schematic block diagrams of an encoder, according to possible embodiments.

FIG. 11, in conjunction with FIG. 2, shows an encoder 600 operable in a base station system 100 of a wireless communication network, for handling a bit stream for transmission over a transmission link 165 between a remote unit 160 and a base unit 170 of the base station system, the remote unit being arranged to transmit wireless signals to and receive wireless signals from mobile stations 180. The bit stream comprises a first OFDM symbol and a second OFDM symbol, each OFDM symbol comprising a number of consecutive IQ samples. The encoder comprises a processor and a memory. The memory contains instructions executable by said processor, whereby the encoder is operative for, for a first number of the IQ samples situated at a boundary between the first and the second OFDM symbol, transmitting, over the transmission link to a decoder of the base station system, the first number of IQ samples having a representation spanning a first amplitude range. The encoder is further operative for, for a second number of IQ samples of the second OFDM symbol, following the first number of IQ samples, converting, using a predictive filter, individual of the second number of IQ samples to IQ prediction errors, where the IQ prediction errors have a representation spanning a second amplitude range that is smaller than the first amplitude range, and transmitting the IQ prediction errors over the transmission link to the decoder.

According to an embodiment, the representation of the first number of IQ samples spanning a first amplitude range signifies that the first number of IQ samples are transmitted un-coded.

According to another embodiment, the representation of the first number of IQ samples spanning a first amplitude range signifies that the first number of IQ samples are quantized with a first number of bits before being transmitted, and wherein the IQ prediction errors of the second number of IQ samples are quantized with fewer bits than the first number of bits.

According to another embodiment, the encoder is further operative for, for the second number of IQ samples, applying an entropy encoding on the IQ prediction errors, and wherein the encoder is operative for transmitting IQ prediction errors by transmitting the entropy encoded IQ prediction errors to the decoder.

According to another embodiment, the second OFDM symbol comprises a plurality of blocks of IQ samples, and for a first IQ sample of each block following a block border between two consecutive blocks, the encoder is operative to transmit the first sample of each block uncoded to the decoder.

According to another embodiment, filter coefficients of the predictive filter are pre-set and kept un-changed for the bit stream.

According to another embodiment, the encoder is further operative for scaling the IQ prediction errors based on a scaling factor.

According to other embodiments, the encoder 600 may further comprise a communication unit 602, which may be considered to comprise conventional means for communicating with a decoder of the base station system. The instructions executable by said processor 603 may be arranged as a computer program 605 stored e.g. in said memory 604. The processor 603 and the memory 604 may be arranged in a sub-arrangement 601. The sub-arrangement 601 may be a micro-processor and adequate software and storage therefore, a Programmable Logic Device, PLD, or other electronic component(s)/processing circuit(s) configured to perform the methods mentioned above.

The computer program 605 may comprise computer readable code means, which when run in the encoder 600 causes the encoder to perform the steps described in any of the described embodiments of the encoder. The computer program 605 may be carried by a computer program product connectable to the processor 603. The computer program product may be the memory 604. The memory 604 may be realized as for example a RAM (Random-access memory), ROM (Read-Only Memory) or an EEPROM (Electrical Erasable Programmable ROM). Further, the computer program may be carried by a separate computer-readable medium, such as a CD, DVD or flash memory, from which the program could be downloaded into the memory 604. Alternatively, the computer program may be stored on a server or any other entity connected to the communication network to which the encoder 600 has access via the communication unit 602. The computer program may then be downloaded from the server into the memory 604.

Figure 12:
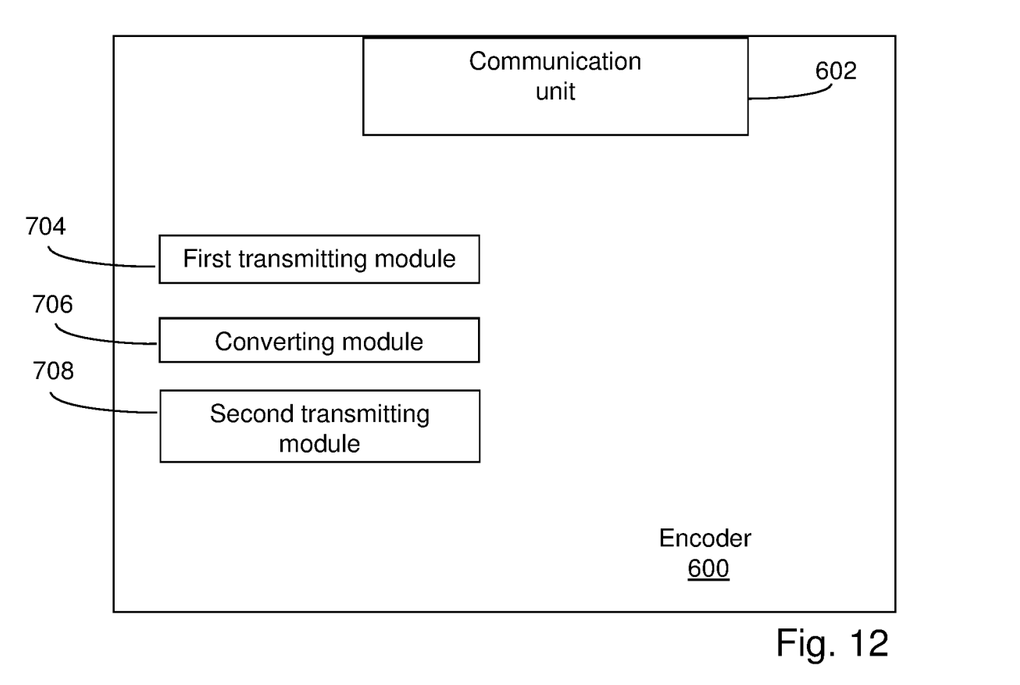

FIG. 12, in conjunction with FIG. 2, shows an encoder 600 operable in a base station system 100 of a wireless communication network, for handling a bit stream for transmission over a transmission link 165 between a remote unit 160 and a base unit 170 of the base station system. The remote unit is arranged to transmit wireless signals to and receive wireless signals from mobile stations 180. The bit stream comprises a first OFDM symbol and a second OFDM symbol, each OFDM symbol comprising a number of consecutive IQ samples. The encoder 600 comprises a first transmitting module 704 for transmitting a first number of the IQ samples, situated at a boundary between the first and the second OFDM symbol, over the transmission link to a decoder of the base station system, the first number of IQ samples having a representation spanning a first amplitude range. The encoder further comprises a converting module 706 for converting individual of a second number of IQ samples of the second OFDM symbol, following the first number of IQ samples, to IQ prediction errors, using a predictive filter, where the IQ prediction errors have a representation spanning a second amplitude range that is smaller than the first amplitude range, and a second transmitting module 708 for transmitting the IQ prediction errors over the transmission link to the decoder. The encoder 600 may further comprise a communication unit 602 similar to the communication unit of FIG. 11.

Figure 13:
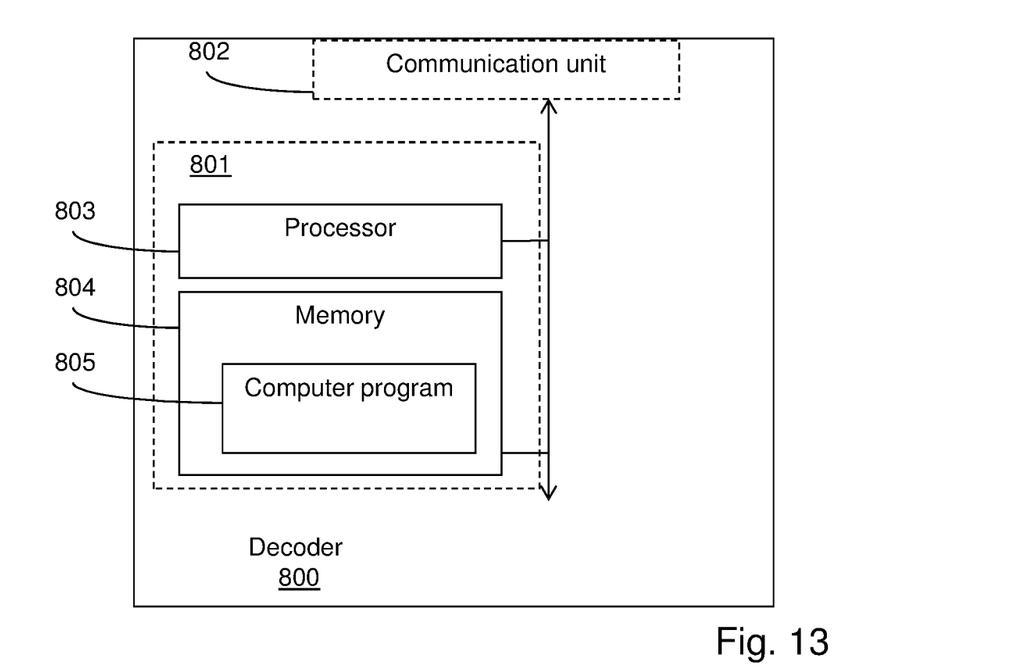
FIGS. 13-14 are schematic block diagrams of a decoder, according to possible embodiments.

FIG. 13 shows a decoder 800 operable in a base station system 100 of a wireless communication network, for handling a bit stream for reception over a transmission link 165 between a remote unit 160 and a base unit 170 of the base station system. The remote unit is arranged to transmit wireless signals to and receive wireless signals from mobile stations. The bit stream comprises a first OFDM symbol and a second OFDM symbol, each OFDM symbol comprising a number of consecutive IQ samples. The decoder comprises a processor and a memory. The memory contains instructions executable by said processor, whereby the decoder 800 is operative for receiving a first number of the IQ samples, situated at a boundary between the first and the second OFDM symbol over the transmission link from an encoder of the base station system, the first number of IQ samples having a representation spanning a first amplitude range. The decoder is further operative for, for a second number of IQ samples of the second OFDM symbol, following the first number of IQ samples, receiving, over the transmission link from the encoder, IQ prediction errors representing the second number of IQ samples, the IQ prediction errors have a representation spanning a second amplitude range that is smaller than the first amplitude range, and converting, using a recovery predictive filter, individual of the IQ prediction errors to estimations of individual of the second number of IQ samples.

According to an embodiment, the decoder is further operative for receiving the IQ prediction errors entropy encoded from the encoder, and, for the second number of IQ samples, applying an entropy decoding on the entropy encoded IQ prediction errors.

According to an embodiment, the decoder is further operative for converting individual of the IQ prediction errors to second number of IQ samples by determining a prediction of one sample of the second IQ samples based on one or more determined previous IQ samples immediately before the one sample, and a received prediction error.

According to other embodiments, the decoder 800 may further comprise a communication unit 802, which may be considered to comprise conventional means for communicating with an encoder of the base station system. The instructions executable by said processor 803 may be arranged as a computer program 805 stored e.g. in said memory 804. The processor 803 and the memory 804 may be arranged in a sub-arrangement 801. The sub-arrangement 801 may be a micro-processor and adequate software and storage therefore, a Programmable Logic Device, PLD, or other electronic component(s)/processing circuit(s) configured to perform the methods mentioned above.

The computer program 805 may comprise computer readable code means, which when run in the decoder 800 causes the decoder to perform the steps described in any of the described embodiments of the decoder. The computer program 805 may be carried by a computer program product connectable to the processor 803. The computer program product may be the memory 804. The memory 804 may be realized as for example a RAM (Random-access memory), ROM (Read-Only Memory) or an EEPROM (Electrical Erasable Programmable ROM). Further, the computer program may be carried by a separate computer-readable medium, such as a CD, DVD or flash memory, from which the program could be downloaded into the memory 804. Alternatively, the computer program may be stored on a server or any other entity connected to the communication network to which the decoder 800 has access via the communication unit 802. The computer program may then be downloaded from the server into the memory 804.

Figure 14:
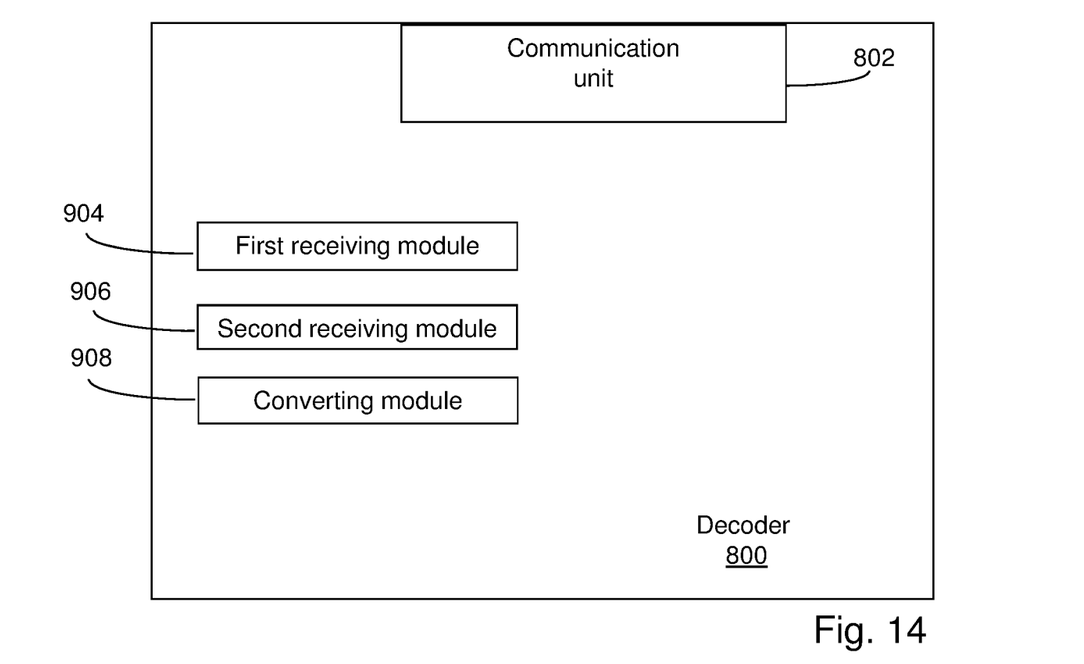

FIG. 14, in conjunction with FIG. 2, shows a decoder 800 operable in a base station system 100 of a wireless communication network, for handling a bit stream for reception over a transmission link 165 between a remote unit 160 and a base unit 170 of the base station system. The remote unit is arranged to transmit wireless signals to and receive wireless signals from mobile stations 180. The bit stream comprises a first OFDM symbol and a second OFDM symbol, each OFDM symbol comprising a number of consecutive IQ samples. The decoder 800 comprises a first receiving module 904 for receiving a first number of the IQ samples situated at a boundary between the first and the second OFDM symbol over the transmission link from an encoder of the base station system, the first number of IQ samples having a representation spanning a first amplitude range. The decoder further comprises a second receiving module 906 for receiving IQ prediction errors representing a second number of IQ samples of the second OFDM symbol, following the first number of IQ samples, over the transmission link from the encoder, the IQ prediction errors having a representation spanning a second amplitude range that is smaller than the first amplitude range, and a converting module 908 for converting, using a recovery predictive filter, individual of the IQ prediction errors to estimations of individual of the second number of IQ samples. The decoder 800 may also comprise a communication unit 802 similar to the communication unit 802 of FIG. 13.

Although the description above contains a plurality of specificities, these should not be construed as limiting the scope of the concept described herein but as merely providing illustrations of some exemplifying embodiments of the described concept. It will be appreciated that the scope of the presently described concept fully encompasses other embodiments which may become obvious to those skilled in the art, and that the scope of the presently described concept is accordingly not to be limited. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for an apparatus or method to address each and every problem sought to be solved by the presently described concept, for it to be encompassed hereby. In the exemplary figures, a broken line generally means that what is within the broken line is optional.

The invention claimed is:

1. A method performed by an encoder of a base station system of a wireless communication network, for handling a bit stream for transmission over a transmission link between a remote unit and a base unit of the base station system, the remote unit being arranged to transmit wireless signals to and receive from mobile stations, the bit stream comprising a first OFDM symbol and a second OFDM symbol, each OFDM symbol comprising a number of consecutive IQ samples, the method comprising:

for a first number of the IQ samples situated at a boundary between the first and the second OFDM symbol, transmitting, over the transmission link to a decoder of the base station system, the first number of IQ samples having a representation spanning a first amplitude range;

for a second number of IQ samples of the second OFDM symbol following the first number of IQ samples, converting, using a predictive filter, individual of the second number of IQ samples to IQ prediction errors, where the IQ prediction errors have a representation spanning a second amplitude range that is smaller than the first amplitude range; and transmitting the IQ prediction errors over the transmission link to the decoder.

2. The method of claim 1, wherein the representation of the first number of IQ samples spanning a first amplitude range signifies that the first number of IQ samples are transmitted un-coded.

3. The method of claim 1, wherein the representation of the first number of IQ samples spanning a first amplitude range signifies that the first number of IQ samples are quantized with a first number of bits before being transmitted, and wherein the IQ prediction errors of the second number of IQ samples are quantized with fewer bits than the first number of bits.

4. The method of claim 1, further comprising, for the second number of IQ samples:

applying an entropy encoding on the IQ prediction errors, and wherein the transmission of IQ prediction errors comprises transmitting the entropy encoded IQ prediction errors to the decoder.

5. The method of claim 4, wherein a dictionary used for the entropy encoding is pre-set and kept un-changed for the bit stream.

6. The method of claim 1, wherein the converting of individual of the second number of IQ samples comprises:

determining a prediction of one sample of the second IQ samples based on one or more previous IQ samples immediately before the one sample; and calculating a prediction error as a difference between the determined prediction of the one IQ sample and an original value of the one IQ sample.

7. The method of claim 1, wherein the second OFDM symbol comprises a plurality of blocks of IQ samples, and wherein for a first IQ sample of each block following a block border between two consecutive blocks, the first sample of each block is transmitted uncoded to the decoder.

8. The method of claim 1, wherein filter coefficients of the predictive filter are pre-set and kept un-changed for the bit stream.

9. The method of claim 1, further comprising:

scaling the IQ prediction errors based on a scaling factor.

10. A computer program product comprising a non-transitory computer readable medium storing instructions for causing an encoder to perform the method of claim 1.

11. A method performed by a decoder of a base station system of a wireless communication network, for handling a bit stream for reception over a transmission link between a remote unit and a base unit of the base station system, the remote unit being arranged to transmit wireless signals to and receive from mobile stations, the bit stream comprising a first OFDM symbol and a second OFDM symbol, each OFDM symbol comprising a number of consecutive IQ samples, the method comprising:

for a first number of the IQ samples situated at a boundary between the first and the second OFDM symbol, receiving, over the transmission link from an encoder of the base station system, the first number of IQ samples having a representation spanning a first amplitude range, for a second number of IQ samples of the second OFDM symbol following the first number of IQ samples, receiving, over the transmission link from the encoder, IQ prediction errors representing the second number of IQ samples, the IQ prediction errors having a representation spanning a second amplitude range that is smaller than the first amplitude range, and converting, using a recovery predictive filter, individual of the IQ prediction errors to estimations of individual of the second number of IQ samples.

12. The method of claim 11, wherein the IQ prediction errors are received entropy encoded from the encoder, and the method further comprises, for the second number of IQ samples, applying an entropy decoding on the entropy encoded IQ prediction errors.

13. The method of claim 11, wherein the converting of individual of the IQ prediction errors to second number of IQ samples comprises:

determining a prediction of one sample of the second IQ samples based on one or more determined previous IQ samples immediately before the one sample, and a received prediction error.

14. The method of claim 11, wherein the second OFDM symbol comprises a plurality of blocks of IQ samples, and wherein for a first IQ sample of each block, following a block border between two consecutive blocks, the first sample of each block is received uncoded from the encoder.

15. The method of claim 11, wherein filter coefficients of the recovery predictive filter are pre-set to the same values as filter coefficients of a predictive filter at the encoder, and kept un-changed for the bit stream.

16. The method of claim 11, further comprising re-scaling the IQ prediction errors based on an inverse of a scaling factor used at the encoder.

17. A computer program product comprising a non-transitory computer readable medium storing instructions for causing a decoder to perform the method of claim 11.

18. An encoder operable in a base station system of a wireless communication network, for handling a bit stream for transmission over a transmission link between a remote unit and a base unit of the base station system, the remote unit being arranged to transmit wireless signals to and receive wireless signals from mobile stations, the bit stream comprising a first OFDM symbol and a second OFDM symbol, each OFDM symbol comprising a number of consecutive IQ samples, the encoder comprising a processor and a memory, said memory containing instructions executable by said processor, whereby the encoder is operative for:

for a first number of the IQ samples, situated at a boundary between the first and the second OFDM symbol, transmitting, over the transmission link to a decoder of the base station system, the first number of IQ samples having a representation spanning a first amplitude range, for a second number of IQ samples of the second OFDM symbol, following the first number of IQ samples, converting, using a predictive filter, individual of the second number of IQ samples to IQ prediction errors, where the IQ prediction errors have a representation spanning a second amplitude range that is smaller than the first amplitude range, and transmitting the IQ prediction errors over the transmission link to the decoder.

19. A decoder operable in a base station system of a wireless communication network, for handling a bit stream for reception over a transmission link between a remote unit and a base unit of the base station system, the remote unit being arranged to transmit wireless signals to and receive wireless signals from mobile stations, the bit stream comprising a first OFDM symbol and a second OFDM symbol, each OFDM symbol comprising a number of consecutive IQ samples, the decoder comprising a processor and a memory, said memory containing instructions executable by said processor, whereby the decoder is operative for:

for a first number of the IQ samples, situated at a boundary between the first and the second OFDM symbol, receiving, over the transmission link from an encoder of the base station system, the first number of IQ samples having a representation spanning a first amplitude range, for a second number of IQ samples of the second OFDM symbol, following the first number of IQ samples, receiving, over the transmission link from the encoder, IQ prediction errors representing the second number of IQ samples, the IQ prediction errors having a representation spanning a second amplitude range that is smaller than the first amplitude range, and converting, using a recovery predictive filter, individual of the IQ prediction errors to estimations of individual of the second number of IQ samples.

* * * * *